United States Patent [19]

Schenk

[11] Patent Number: 4,701,873
[45] Date of Patent: Oct. 20, 1987

[54] METHOD AND A CIRCUIT ARRANGEMENT FOR DIGITAL SIGNAL PROCESSING UTILIZING ADAPTIVE TRANSVERSAL FILTER TECHNIQUES

[75] Inventor: Heinrich Schenk, Munich, Fed. Rep. of Germany

[73] Assignee: Siemens Aktiengesellschaft, Berlin and Munich, Fed. Rep. of Germany

[21] Appl. No.: 681,596

[22] Filed: Dec. 14, 1984

[30] Foreign Application Priority Data

Dec. 14, 1983 [DE] Fed. Rep. of Germany ....... 3345284

[51] Int. Cl.$^4$ .............................................. G06F 7/38
[52] U.S. Cl. ................................................... 364/724
[58] Field of Search ....................................... 364/724

[56] References Cited

U.S. PATENT DOCUMENTS

| | | | |
|---|---|---|---|
| 3,993,890 | 11/1976 | Peled, et al. | 364/724 |
| 4,092,618 | 5/1978 | Guidoux | 364/724 X |
| 4,369,499 | 1/1983 | Northam | 364/724 |
| 4,374,426 | 2/1983 | Burlage, et al. | 364/724 |
| 4,377,793 | 3/1983 | Horna | 364/724/X |
| 4,468,786 | 8/1984 | Davis | 364/724 X |
| 4,550,415 | 10/1985 | Debus, Jr. et al. | 364/724 |
| 4,571,732 | 2/1986 | Pirani et al. | 364/724 |
| 4,615,026 | 9/1986 | Schiff | 364/724 |

OTHER REFERENCES

Bocker, "Datenübertragung" 1976, vol. 1, pp. 214–231.
Mueller, "Combining Echo Cancellation and Decision Feedback Equalization", The Bell System Tech. Journal, vol. 58, No. 2, Feb. 1979, pp. 491–500.
Dingle dey, "Der Fernmelde-Ingenieur," vol. 31, No. 12, Feb. 1977, pp. 1–27.
Cowan et al., "New Digital Adaptive-Filter Implementation Using Distributed-Arithmetic Techniques," IEEE Proc., vol. 128, No. 4, Aug. 1981, pp. 225–230.
Moehrmann, "The Adaptive Equalization of Transmission Systems," AGARD Conf. Proc. No. 103, 1972, pp. 12.1–12.16.

Primary Examiner—Archie E. Williams, Jr.
Assistant Examiner—Long Thanh Nguyen
Attorney, Agent, or Firm—Hill, Van Santen, Steadman & Simpson

[57] ABSTRACT

For digital signal processing with a transversal filter having a (N−1) stage delay chain which is fed at its input with the digital signal to be processed and is provided with taps, subsum signals are stored which correspond to the N/w consecutive groups of, in each case $A^w$ possible combinations of, in each case, w consecutive, A-value tapped signal elements, where the subsum signals are formed from tapped signal elements which are each assigned to a group and are evaluated in accordance with the relevant filter setting. During each delay stage, in accordance with the relevant N/w actual combinations tapped elements, the associated subsum signals are successively read from a memory and added to one another to form an output signal element. The subsum signals can be iteratively formed in that each of the successively-read subsum signals, combined with a correction value, forms a corrected subsum signal which is stored in place of the read subsum signal as a new subsum signal.

12 Claims, 2 Drawing Figures

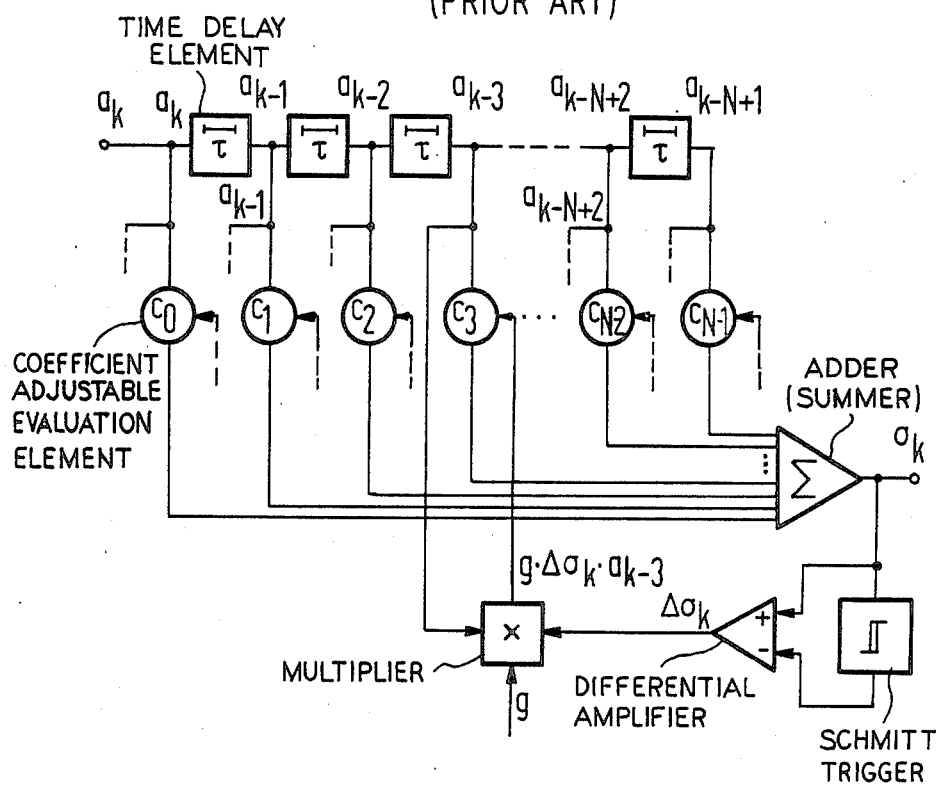

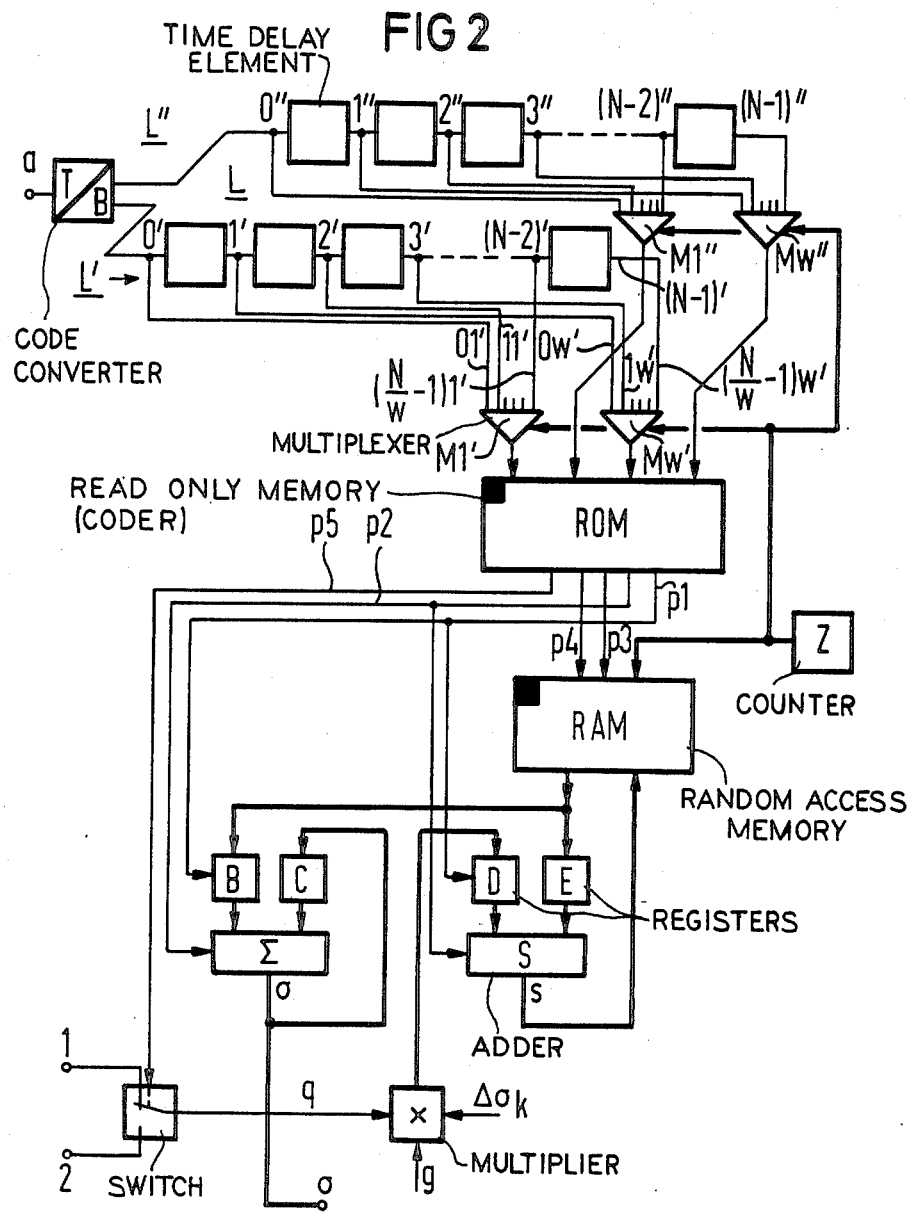

METHOD AND A CIRCUIT ARRANGEMENT FOR DIGITAL SIGNAL PROCESSING UTILIZING ADAPTIVE TRANSVERSAL FILTER TECHNIQUES

BACKGROUND OF THE INVENTION

1. Field of the Invention

The present invention relates to digital signal processing and is particularly concerned with such processing as may occur through the utilization of adaptive transversal filters.

2. Description of the Prior Art

In signal transmission in digital telecommunications systems, linear signal distortions can occur, for the equalization of which adaptive equalizers (and also compromise equalizers) are to be used, which normally consist of transversal filters. A transversal filter of this type is a delay chain which, at its input end, is fed in a stepped fashion with the signal to be processed and which, before and following each stage, (which in each case corresponds to one delay step) is provided with taps, where at each delay step the tapping signal elements which occur at each of the taps are evaluated (multiplied) in accordance with filter coefficients individually assigned to the taps, i.e. possibly amplified, attenuated and/or changed with respect to sign, and thus added to form filter output signal element. In a so-called adaptive transversal filter, the filter coefficient can be adaptively adjusted in accordance with an error signal as noted in the publications NTZ Vol. 24, No. 1, 1971, pp. 18–24 and Bocker: Datenübertragung, 1976, Vol. 1, Chapter 5.3.2 or permanently set (compromise filter). Apart from purposes of signal equalization, transversal filters can also be used in crosstalk and/or echo compensation circuits for the compensation of interference signals as set forth in the publications AGARD Conference Proceedings No. 103, 1972, pp. 12-1–12-16; Der Fernmelde-Ingenieur Vol. 31, No. 12, 1977, pp. 1–25 and the Bell System Technical Journal Vol. 58, No. 2, 1979, pp. 491–500.

In a $N-1$ stage transversal filter, as illustrated in FIG. 1, which is well known in the art, the value of the output signal element $\sigma_k$, obtained in a time element k can be described by $$\sigma_k = \sum_{i=0}^{N-1} a_{k-i} \cdot c_i$$

wherein $a_{k-i}$ signifies the values of the tapped signal elements which occur in this time element at the individual taps of the delay chain, and $c_i$ signifies the N filter coefficients which determine the properties (frequency response, time characteristics) of the filter. In the case of adaptive filter adjustment, the individual filter coefficient $c_i$ can be adjusted in a stepped manner in an iteration which can be approximately described by $$c_{i(k+1)} = c_{i(k)} - g \cdot \Delta \sigma_k \cdot a_{k-i}$$

wherein g represents the so-called adjustment value which determines the run-in time of the filter to the desired state, and the necessary coefficient word length, and therefore the filter accuracy, which however, in order to ensure a reliable run-in (filter convergence) should also not be selected to be too high; $\Delta \sigma_k$ is the error, which remains in relation to a desired theoretical value, of the currently considered output signal element. Instead of such an error, it can also be possible to use only the sign sgn ($\Delta \sigma_k$) thereof as an adjustment criterion.

The construction of a transversal filter of this kind requires N coefficient memories, and in the processing of binary or ternary digital signals in respect of each delay step, i.e. in each time element, N tapped signal elements, evaluated in accordance with the stored filter coefficients, must be added, i.e. (a maximum of) N additions or subtractions must be carried out. In the adaptive adjustment of the filter coefficients, in respect of each delay element, N correction values must be calculated for the N coefficients. This assumes a high processing speed which corresponds to the length of the transversal filter, i.e. the value of N, which however, will not always exist for technical reasons.

SUMMARY OF THE INVENTION

The object of the invention is to facilitate digital processing in the manner of a preferably adaptive transversal filter with a $(N-1)$ stage delay chain, even at lower processing speeds.

More particularly, the present invention relates to a method of digital signal processing in the manner of a preferably adaptive transversal filter, with a $(N-1)$ stage delay chain which is supplied at its input end with the digital signal which is to be processed, and which is provided with taps. This method is particularly characterized, according to the present invention, by the storage of the subsum signals which correspond to the N/w consecutive groups of in each case $A^w$ possible combinations of in each case w consecutive A-valued tapped signal elements, and which consist of the associated tapped signal elements which have been evaluated in accordance with the particular filter setting. The method is further characterized in that during each delay step, in accordance with the N/w actual combinations of digital signal elements, the associated subsum signals are successively read and added to one another to form an output signal element. In accordance with a feature of the invention, iterative formation of subsum signals is provided in that each of the successively read subsum signals, combined with a correction value, forms a corrected subsum signal which is stored, in place of the read subsum signal, as a new subsum signal.

The invention, which in the addition of the evaluated tapped signal elements to form the relevant output signal element, in each case has groups of w evaluated tapped signal elements in combined form, and adds only their stored subsidiary signals, provides the advantage that only N/w arithmetic operations need be carried out in each delay step, i.e. each time element. In the case of the filter adjustment, only N/w correction values need be specified which, however, now do not relate to filter coefficients as such, but to the aforementioned subsum signals which themselves are dependent both upon the desired filter characteristics and upon the digital signal elements input into the delay chain, and therefore require a large storage capacity for their storage.

In the iterative formation of subsum signals, during each delay step, individual subsum signals can be corrected in accordance with the output signal error which occurs during this delay step and which is evaluated with a control value. However, in accordance with a further feature of the invention it is also possible to correct the individual subsum signals in accordance with the output signal error which is evaluated with the control value and with the sum of the squares of the tapped signal elements, in order in this manner to expedite the filter adjustment.

In view of the necessary storage capacity, it is advantageous to store only those subsum signals which differ from zero or, in the case of a sign-symmetrical digital signal, to store subsum signals which differ only in respect of their sign only once, and during each delay step to add or subtract the successively read subsum signals in accordance with the actual combination of digital signal elements in order to form the output signal element or the corrected subsum signal which is to be newly stored.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a schematic representation of a known transversal filter; and

FIG. 2 is a schematic representation of an exemplary embodiment of the transversal filter constructed in accordance with the present invention.

DESCRIPTION OF THE PREFERRED EMBODIMENTS

In order to illustrate the known transversal filter technology, FIG. 1 schematically represents a $(N-1)$-stage adaptive transversal filter having a chain of delay elements which is provided with taps $a_k$, $a_{k-1}$, $a_{k-2}$, $a_{k-3}, \ldots a_{k-N+2}$, $a_{k-N+1}$ which possess the delay time $\tau$, and whose taps extend by way of an adjustable evaluation element $c_0, c_1, c_2, c_3, \ldots c_{N-2}, c_{N-1}$ to an adder $\Sigma$. Input digital signal elements fed in stepped fashion to the filter input $a_k$ are tapped, each having been delayed by a further time element $\tau$, at the following taps $a_{k-1}, \ldots a_{k-N+1}$ of the delay chain, where, in each time element, all of the digital signal elements which have just been tapped are evaluated in the evaluation elements $c_0 \ldots c_{N-1}$ in accordance with the set filter coefficients, i.e. are each multiplied by the relevant filter coefficient in order then to be added in the adder $\Sigma$ to form the output signal element which occurs in this time element, as already discussed above. In order that the digital signal can be processed, i.e. filtered (in the time range), the filter coefficients must be correctly set. In the case of an adaptive transversal filter, as illustrated in FIG. 1, this automatically takes place in an iteration in which, in each time element, i.e. repeated with each delay step, in dependence upon the difference $\Delta \sigma_k$ of the digital signal element which occurs at the filter output $\sigma_k$ from a theoretical value (determined for example by a decision device to be constructed as a Schmitt trigger, where, in accordance with FIG. 1, the error $\Delta \sigma_k$ multiplied by the relevant tapped signal element value $a_{k-i}$ and the adjustment value g, results in the relevant correction value for the relevant current filter coefficient, as has already been set forth above.

In the case of the transversal filter shown in FIG. 1, in each time element $\tau$, i.e. each delay step for the (serial) addition of the individual, evaluated tapped signal elements, the adder $\Sigma$ must carry out a total of N additions (or subtractions), and again N arithmetic operations must be carried out to correct the N coefficients for the coefficient adjustment during each delay step.

With a comparatively smaller number of arithmetic operations, the digital signal processing can be carried out in the manner of a transversal filter using a circuit arrangement constructed in accordance with the present invention.

On a scale necessary for the understanding of the invention, FIG. 2 schematically illustrates an exemplary embodiment of a circuit arrangement constructed in accordance with the invention for digital signal processing in the manner of an adaptive transversal filter. This circuit arrangement comprises a $(N-1)$ stage time delay chain (L) which is supplied at its input with a digital signal to be processed, and which is provided with taps $(0, 1, 2, 3, \ldots N-2, N-1)$. For this purpose, FIG. 2 indicates that in a code converter T/B, a ternary signal supplied to the input a of the time delay chain L as the digital signal to be processed is first recoded into a pair of binary signals which comprise a binary amount signal and a binary sign signal. The time delay chain L then contains a $N-1$ stage arm $L'$ which is supplied with the binary sign signal and a $N-1$ stage arm $L''$ which is supplied with the binary sum signal. A delay chain L which includes each group of w consecutive taps of the N/w groups of taps is connected to inputs, each assigned to this group of taps, of a scanning device M having N/w groups of inputs. As indicated in FIG. 2, for each arm $L'$, $L''$ of the delay chain, this scanning device M can possess w multiplexers $M1'$, $Mw'$, $M1''$, $Mw''$ which are controlled by a counter Z in synchronism and which each possess N/w inputs, and whose inputs are each connected to the taps, which correspond to one another, of the individual group of taps. In the exemplary embodiment illustrated in FIG. 2, in which $w=2$ consecutive taps are combined to form a group, the taps $0'$, $1'$ which form such a group of the delay chain arm $L'$, which has $N/w=N/2$ such groups of taps $0', 1'; \ldots; (N-2)', (N-1)'$ are connected to the inputs $01'$, $0w'$, assigned to this group of taps of the two multiplexers $M1'$ and $Mw'$ of the scanning device M and the following group of the two taps $2', 3'$ is connected to the multiplexer inputs $11'$, $1w'$, and so on; finally, the taps $(N-2)'$ and $(N-1)'$, which form the last group of taps, are connected to the inputs $((N/W)-1)1'$ and $((N/W)-1)w'$ of the two multiplexers $M1'$ and $Mw'$. As can be seen from FIG. 2, the same also applies to the connections of the taps $0''$, $1''$; $2''$, $3''$; $\ldots$ ; $(N-2)''$, $(N-1)''$ of the delay chain arm $L''$, and the corresponding inputs of the multiplexers $M1''$ and $Mw''$, without requiring a detailed explanation. The scanning device formed in accordance with FIG. 2 by the four multiplexers $M1' \ldots M2w''$ will be assumed to be N/W times faster than the delay chain $L'$, $L''$, so that in each delay step, i.e. in each delay element, all of the taps of the delay chain are scanned.

At their outputs, the multiplexers $M1' \ldots Mw''$ of the scanning device are connected to a common coder ROM which, in the exemplary embodiment illustrated in FIG. 2, is formed by a read only memory and in which the pair of two consecutive ternary signal elements which has just been scanned by the scanning device M, to be more precise the quadruple corresponding to such a pair of ternary signal elements of the binary signal elements occurring at the corresponding taps of the two chain arms $L'$, $L''$ will be assumed to be recorded as illustrated in the following Table I.

TABLE I

| Ternary Signal Group | | Sign | | Amount | | | | | | |
|---|---|---|---|---|---|---|---|---|---|---|
| $t_{1-i}$ | $t_{k-i-1}$ | ml' | mw' | ml'' | mw'' | p1 | p2 | p3 | p4 | p5 |
| +1 | +1 | 0 | 0 | L | L | L | 0 | L | L | L |
| +1 | 0 | 0 | 0 | L | 0 | L | 0 | L | 0 | 0 |
| +1 | −1 | 0 | L | L | L | L | 0 | 0 | L | L |
| 0 | +1 | 0 | 0 | 0 | L | L | 0 | 0 | 0 | L |
| 0 | 0 | 0 | 0 | 0 | 0 | 0 | . | . | . | . |
| 0 | −1 | 0 | L | 0 | L | L | L | 0 | 0 | 0 |
| −1 | +1 | L | 0 | L | L | L | L | 0 | L | L |
| −1 | 0 | L | 0 | L | 0 | L | L | L | 0 | 0 |
| −1 | −1 | L | L | L | L | L | L | L | L | L |

In Table I, in the columns $t_{k-1}$ and $k_{k-i-1}$ the possible pairs of consecutive ternary signal elements are indicated, and the columns ml', mw', ml'' and mw'' indicate the corresponding sign and amount signal bits which occur in accordance with FIG. 2 at the outputs of the multiplexers M1', Mw', M1'' and Mw''. The control bits which correspond to the individual quadruples of sign and amount signal bits and which occur at the outputs p1 ... p5 of the coder ROM are indicated in the column $p_1$ ... $p_5$ in the table. Here, the control bits $p_3$ and $p_4$, in supplementation of a group address emitted from the counter Z, serve to drive individual storage positions of a subsum signal memory RAM, a random access memory.

The memory RAM, which in the case of adaptive signal filtering is designed as a read-write memory, stores the subsum signals which correspond to the $A^w \cdot N/w$ possible combinations of, in each case, w consecutive signal elements of an A-value digital signal of N/w consecutive groups of digital signal elements and which consist of the associated tapped signal elements which have been evaluated in accordance with the relevant filter setting. In the present exemplary embodiment, where w=2 and A=3, therefore, under each group address, i.e. for a $j^{th}$ group of taps (where j=0 .. . ((N/W)−1), the subsum signal memory RAM basically stores the subsum referred to in the column F of the following table II, in which the individual addends c represent the filter coefficients which correspond to the particular index and which would be explicitly stored in a transversal filter as shown in FIG. 1. It will be seen that basically the subsums which correspond to the $A^w = 3^2 = 9$ possible combinations of in each case w=2 consecutive ternary signal elements and which consist of the associated w=2 tapped signal elements $T_{k-2j}$, $T_{k-2j-1}$ which are evaluated in accordance with the filter setting, i.e. are multiplied by the particular coefficients c, are fundamentally stored, from which a subsum is read in accordance with the pair of control bits $p_3$, $p_4$, and therefore in accordance with the particular scanned tapped signal elements.

TABLE II

| Ternary Signal Group | | | | F(k,j) | |
|---|---|---|---|---|---|
| $t_{k-2j}$ | $t_{k-2j-1}$ | $P_3$ | $P_4$ | | |
| +1 | +1 | L | L | $+c_{2j}$ | $+c_{2j+1}$ |
| +1 | 0 | L | 0 | $+c_{2j}$ | |
| +1 | −1 | 0 | L | $+c_{2j}$ | $-c_{2j+1}$ |
| 0 | +1 | 0 | 0 | | $+c_{2j+1}$ |
| 0 | 0 | . | . | 0 | |
| 0 | −1 | 0 | 0 | | $-c_{2j+1}$ |
| −1 | +1 | 0 | L | $-c_{2j}$ | $+c_{2j+1}$ |
| −1 | 0 | L | 0 | $-c_{2j}$ | |
| −1 | −1 | L | L | $-c_{2j}$ | $-c_{2j+1}$ |

In Table II, for the nine possible ternary signal groups $t_{k-2j}$, $k_{k-2j+1}$ (where j=0 ... ((N/W)−1) and the associated control bits $p_3$, $p_4$ in accordance with Table I, column F indicates the resultant subsum to be generally described by $$F(k,j) = \sum_{v=0}^{w-1} a_{k-wj-v} \cdot c_{wj+v}$$

which consists of the tapped signal elements a, each evaluated with a filter coefficient c, of a group of w such signal elements.

The storage requirements necessary to store the subsidiary sums is reduced if only the subsum signals which differ from zero are stored, and if, in the case of a sign-symmetrical digital signal, subsum signals which differ only in respect of their sign are stored only once, in which case, during each delay step, the successively-read subsum signal are added or subtracted in accordance with the actual combination of digital signal elements to form an output signal element for a corrected subsum signal which is to be newly stored. The circuit arrangement illustrated in FIG. 2 also operates in this manner, as well be clear from the following discussion.

The output of the subsum signal memory RAM is connected to an input register B of a signal adder Σ from whose output σ a connection extends to another input register C, and which therefore adds, in serial fashion, the subsum signals which are read from the subsum signal memory RAM for each delay step, i.e. in each case during a delay element, where the control bit ($p_2$ in Table I) currently occurring at the output p2 of the coder ROM indicates whether the subsum contained in the input register B is (when $p_2 = 0$) added or (when $p_2 = 1$) is subtracted. If the instantaneously-reached convolution sum is to remain unchanged, a control bit ($p_1 = 0$ in Table 1) occurring at the output p1 of the coder ROM causes the input register B to block so that neither an addition nor a subtraction takes place. If in this manner, in the course of a delay element, the subsidiary signal sums corresponding to the digital signal element occurring at the taps 0', ... (N−1)'; 0'', .. . (N−1)'' of the delay chain L', L'' have been added, i.e. if in this manner for the relevant delay step, in accordance with the relevant N/w actual combinations of ternary signal elements, the associated subsum signals have been successively read and added to one another, then finally the corresponding, processed, i.e. "filtered" output signal element is obtained at the output σ of the circuit arrangement.

To enable the input digital signal to be correctly processed to form the output digital signal, i.e. filtered (in the time range), the subsum signal memory RAM must store the subsum signals corresponding to the desired filtered characteristics. In the circuit arrangement illustrated in FIG. 2, the subsum signals are iteratively formed in an adaptation process in that each of the successively-read subsum signals, combined with a correction value, forms a corrected subsum signal which is stored, in place of the read subsum signal, as a new subsum signal. For this purpose, the output of the subsum signal memory RAM is connected to a first input register E of a signal adder S which can likewise be controlled by the coder ROM and which has a second input register D of the error signal $\Delta\sigma_k$ which occurs during each delay step and is evaluated with a control value g, and whose output s is connected to the write input of the subsum signal memory RAM. The error signal $\Delta\sigma_k$ can be formed in a similar manner to that described in the foregoing with reference to FIG. 1, without the necessity of further details. It should merely be noted that the error signal $\Delta\sigma_k$ can also be averaged and/or need only operate in accordance with its sign, which, however, likewise need not be pursued here in detail.

As can be seen from FIG. 2, in addition to evaluation with the control value g, the error signal $\Delta\sigma_k$ can also be evaluated with a value g, i.e. multiplied, in which case, in accordance with FIG. 2, in dependence upon the control bit $p_5$ currently output by the coder ROM, the value q (where $p_5=0$) has the value 1, or (where $p_5=1$) has the value 2. As can be seen from Table I, the value q is equal to the sum of the squares of the currently-scanned $w=2$ tapped signal elements. As a result of the additional evaluation of the error signal with this sum of the squares of the tapped signal elements or, more generally, with the scaler product $a_{k,j}{}^T \cdot a_{k,j}$ of the vector (row vector $a_{k,j}{}^T$) whose subsidiary components $a_{k-wj-v}$ (where $v=0\ldots, w-1$) describe the collective of the digital signal elements occurring in a $k^{th}$ time element at the taps of the delay chain L with itself (column vector $a_{k,j}$), the subsum adaptation, which can then generally be described by $$F(k,j)_{new} = F(k,j)_{former} - g \cdot \Delta\sigma_k \cdot a_{k,j}{}^T \cdot a_{k,j}$$

can be accelerated where necessary.

Table II represents the nine possible subsums F(k,j) in the case of three-value digital signal (ternary signal) and a group-wise combination of, in each case, $w=2$ tapped signal elements. If, instead, a two-value digital signal (binary signal), i.e. a digital signal which consist only of the two values, plus one and minus one, is to be processed, in which case, in contrast to FIG. 2, the code converter T/B is omitted and only a single delay chain arm need be provided, in the case of group-wise combination of likewise $w=2$ tapped signal elements, only the four two-component subsums F of Table II are possible.

Generally speaking, in the case of an A-value, sign-symmetrical digital signal, the storage of the subsums requires a storage capacity of $$\tfrac{1}{2} \cdot A^w \cdot (N/w) \text{ subsums}$$

where the value A of the digital signal to be processed is an even number, and where the factor $\tfrac{1}{2}$ originates from the fact that, as already stated, when the digital signal is sign-symmetrical only half of the possible subsum values are to be stored. Where the value A is an odd number, the number of possible subsum values to be stored is reduced by 1, since the value 0 does not require storage; then a storage capacity of $$(\tfrac{1}{2}) \cdot (A^w - 1) \cdot (N/w) \text{ subsums}$$

is required.

For different group lengths w, the following Table III indicates the number N/w of arithmetic operations necessary in respect of each delay stage, and the storage capacity, required for the subsum storage, on the one hand for a symmetrical binary signal and on the other hand for a symmetrical ternary signal.

TABLE III

| Arithmetic Operations | | Storage Capacity | |
|---|---|---|---|
| w | N/w | $N/2 \cdot 2^w/w$ | $N/2(3^w-1)/w$ |
| 1 | N | N | N |
| 2 | N/2 | N | $2 \cdot N$ |
| 4 | N/4 | $2 \cdot N$ | $10 \cdot N$ |
| 8 | N/8 | $16 \cdot N$ | $410 \cdot N$ |
| 16 | N/16 | $2048 \cdot N$ | $1345210 \cdot N$ |

It will be clear that where $w=2$, the number of necessary arithmetic operations is halved (in comparison to a $w=1$ corresponding known transversal filter), where, when a binary signal is filtered, the necessary storage capacity does not increase, whereas in the case of the filtering of a ternary signal it is doubled.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may be reasonably and properly be included within the scope of my contribution to the art.

I claim:

1. A method of processing digital signals with a settable adaptive transversal filter which comprises a time delay chain of (N−1) stages having an input for receiving a signal to be processed and having a plurality of signal taps, comprising the steps of:
   storing subsum signals which correspond to the N/w consecutive groups of, in each case, $A^w$ possible combinations of, in each case, w consecutive A-valued tapping signal elements, which have been evaluated in accordance with the relevant filter setting;
   receiving an A-valued digital input signal at the input of the time delay chain; and
   during each delay step, in accordance with the N/w actual combinations of w tapped signal elements, successively reading the associated subsum signals and adding the same to one another to form an output signal.

2. The method of claim 1, and further comprising the steps of:
   iteratively forming the subsum signals by combining each successively-read subsum signal with a correction value to form a corrected new subsum signal and storing each new subsum signal in place of the corresponding read subsum signal.

3. The method of claim 2, and further comprising the steps of:
   during each iterative step, evaluating an output error signal with a control value; and
   correcting each read subsum signal with the evaluated output error signal.

4. The method of claim 3, wherein the step of evaluating is further defined as:
   evaluating the output error signal with the control value and with a sum of the squares of the tapped signal elements.

5. The method of claim 4, for a sign-symmetrical digital signal, wherein:
   the step of storing is further defined as storing subsum signals, which differ only with respect to their sign, only once; and the step of evaluating is further defined as adding and subtracting the successively read subsum signals in accordance with the actual combination of tapped signal elements to form the output signal and the new subsum signals.

6. The method of claim 1, wherein the step of storing is further defined as:
storing only those subsum signals which differ from zero.

7. A circuit arrangement for digital signal processing with a settable adaptive transversal filter, comprising:
an $N-1$ stage delay chain including an input for receiving a serial input digital signal having A possible values, and $N/w$ group of, in each case, w consecutive taps for tapping signal elements;
scanning means operating $N/w$ times faster than said delay chain, including $N/w$ groups of inputs respectively connected to a group of w consecutive taps, and an output;
a coder including an input connected to said output of said scanning means for encoding scan signals, and an output;
memory means including a write-read memory including a control input, a read output and a write output, said control input connected to said output of said coder, for storing subsum signals, said subsum signals corresponding to the $N/w$ consecutive groups of $A^w$ possible combinations each of w consecutive tapped signal elements evaluated in accordance with the relative filter setting; and
adder means comprising a first input circuit connected to said read output of said memory and to said output of said coder, a second input circuit and an output circuit connected to said second input circuit, said adder means operating in response to its input subsum signals during each delay step to provide a processed output signal.

8. The circuit of claim 7, wherein said adder means constitutes a first adder means, and further comprising:
second adder means comprising a first input circuit connected to said read output of said memory, a second input circuit for receiving an evaluated error signal, and an output connected to said write input of said write/read memory; and
error evaluation means connected to said output of said coded and to said second input of said second adder means and operating to evaluate the error signal with a control value and to provide the evaluated error signal to said second adder means during each delay step.

9. The circuit arrangement of claim 8, wherein:
said error evaluation means comprises means operating to evaluate an error signal with the control value and with a sum of the squares of the tapped signal elements.

10. The circuit arrangement of claim 9, wherein:
said scanning means comprises a plurality of multiplexers each including $N/w$ inputs respectively connected to corresponding ones of said taps of the individual groups of taps; and
a synchronous clock generator connected to and synchronously clocking said multiplexers and said write/read memory.

11. The circuit arrangement of claim 7, wherein: said coder comprises a read only memory.

12. The circuit arrangement of claim 7 for processing ternary signals, and further comprising:
input means for receiving and converting a ternary signal into a binary amount signal and a binary sign signal; and wherein
said time delay chain comprises two identical tapped arms each receiving a respective binary signal; and
said scanning means comprises a pair of scanning devices each connected between the taps of the respective arm and said coder.

* * * * *